United States Patent [19]
Yokoyama

[11] Patent Number: 5,092,458
[45] Date of Patent: Mar. 3, 1992

[54] WATERPROOF CASE FOR CAMERA

[75] Inventor: Hiroshi Yokoyama, Chiba, Japan

[73] Assignee: Sony Corporation, Tokyo, Japan

[21] Appl. No.: 710,335

[22] Filed: Jun. 5, 1991

[30] Foreign Application Priority Data

Jun. 20, 1990 [JP] Japan ................... 2-162298

[51] Int. Cl.⁵ .................. B65D 81/00; B65D 85/38
[52] U.S. Cl. ................. 206/316.2; 220/324; 220/664
[58] Field of Search ............... 206/316.1, 316.2; 220/324, 664; 224/908

[56] References Cited

U.S. PATENT DOCUMENTS

| | | | |
|---|---|---|---|
| 2,172,348 | 9/1939 | Githens et al. | 206/316.2 |
| 2,535,152 | 12/1950 | Nelson | 206/316.2 |
| 3,291,179 | 12/1966 | Lang | 206/316.2 |
| 3,860,937 | 1/1975 | Wolfe . | |
| 3,977,013 | 8/1976 | Svatek | 206/316.2 |
| 4,982,841 | 1/1991 | Goedecke | 206/316.2 |
| 5,027,967 | 7/1991 | Tellas | 206/316.2 |

FOREIGN PATENT DOCUMENTS 2212138  7/1989  United Kingdom ............ 206/316.2

*Primary Examiner*—Jimmy G. Foster
*Attorney, Agent, or Firm*—Ronald P. Kananen

[57] ABSTRACT

A waterproof case for a camera, such as a television camera, comprises a case body having a pair of half cases hinged together so as to form a watertight space therein, a camera mounting shoe having a screw to engage the tripod receptacle of the camera, and a back plate having a flexible retaining tongue, a camera seat formed on one of the half cases to hold the camera mount, and a locking member provided on the camera seat so as to engage the flexible retaining tongue to lock the camera mounting shoe in place so that the camera is held securely in the half case provided with the camera seat. In placing the camera in the waterproof case, the camera mounting shoe fastened to the camera by screwing the screw in the tripod receptacle of the camera is inserted into the camera seat provided on one of the half cases, and then the waterproof case is closed. The flexible retaining tongue is deflected elastically by the locking member as the camera mounting shoe is inserted in the camera seat, and then the flexible retaining tongue snaps back to its normal shape to engage the locking member upon the complete insertion of the camera mounting shoe in the camera seat, so that the camera is held securely in place in the waterproof case in a watertight fashion.

5 Claims, 7 Drawing Sheets

WATERPROOF CASE FOR CAMERA

BACKGROUND OF THE INVENTION

1. Field of the Invention

The present invention relates to a waterproof case for enclosing a camera, such as a portable television camera, and, more specifically, to a waterproof case for enclosing a camera, capable of facilitating setting a camera therein and firmly holding the camera therein in a watertight fashion.

2. Description of the Prior Art

A television camera and a portable television camera (which will inclusively be designated as "television cameras" hereinafter) are used very often in the water, at a place close by the water, or in the open under bad weather conditions, such as in rainy, windy, and/or dusty weather. In using a television camera under such unfavorable conditions, the television camera is sealed in a watertight, airtight, waterproof case to protect the television camera. If sealed simply in a waterproof case, the television camera will jolted in the waterproof case, so that the television camera is unable to take pictures or the television camera may be damaged.

A conventional waterproof case for a television camera has an internal space having a shape conforming to the external shape of the television camera so that the television camera can be seated fittingly in the waterproof case. This known waterproof case has a complicated construction and is expensive.

Another conventional waterproof case for a television camera is provided on its bottom wall with a camera fastening screw that engages the tripod receptacle of the television camera to fasten the television camera to the waterproof case with the camera fastening screw so that the television camera will not jolted in the waterproof case. This known waterproof case requires a troublesome operation in putting the television camera in and out of the waterproof case.

SUMMARY OF THE INVENTION

In view of the foregoing problems in the conventional waterproof cases for a television camera, it is an object of the present invention to provide a waterproof case for a camera, such as a television camera, capable of surely enabling setting a camera therein and removing the same therefrom by a single, simple operation and of firmly holding the camera so that the camera will not jolted when the same is operated from outside the waterproof case.

In one aspect of the present invention, a waterproof case for a camera comprises a case body having a pair of half cases hinged together so as to define an airtight space therein, a camera mounting shoe having a screw to engage the tripod receptacle of the camera, and a back plate having a flexible retaining tongue, a camera seat formed on one of the half cases to hold the camera mount, and a locking member provided on the camera seat so as to engage the flexible retaining tongue to lock the camera mounting shoe in place so that the camera is held securely in the half case provided with the camera seat.

The camera mounting shoe fastened to the camera by screwing the screw in the tripod receptacle of the camera is inserted into the camera seat provided on one of the half cases. The waterproof case is closed to seal the camera therein in a watertight fashion. In placing the camera in the waterproof case, the flexible retaining tongue is then deflected elastically as the camera mounting shoe is inserted into the camera seats. The flexible retaining tongue then snaps back into its normal shape to engage the locking member upon the complete insertion of the camera mounting shoe in the camera seat, so that the camera is held securely in place in the waterproof case.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENT

The present invention will be described hereinafter as applied to a waterproof case for a television camera with reference to a preferred embodiment thereof.

Figure 1:
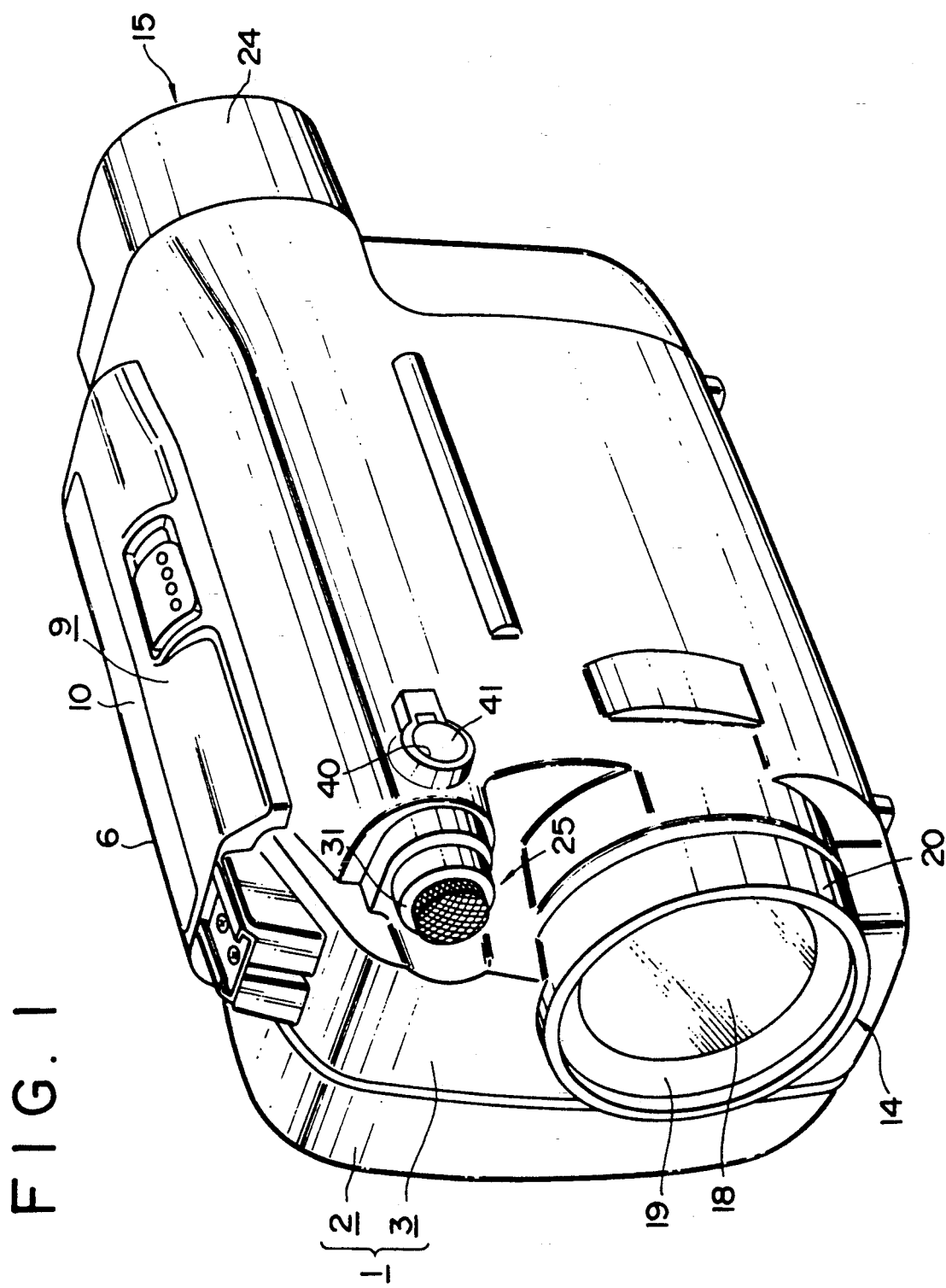
FIG. 1 is a perspective view of a waterproof case for a television camera in a preferred embodiment according to the present invention.
Figure 2:
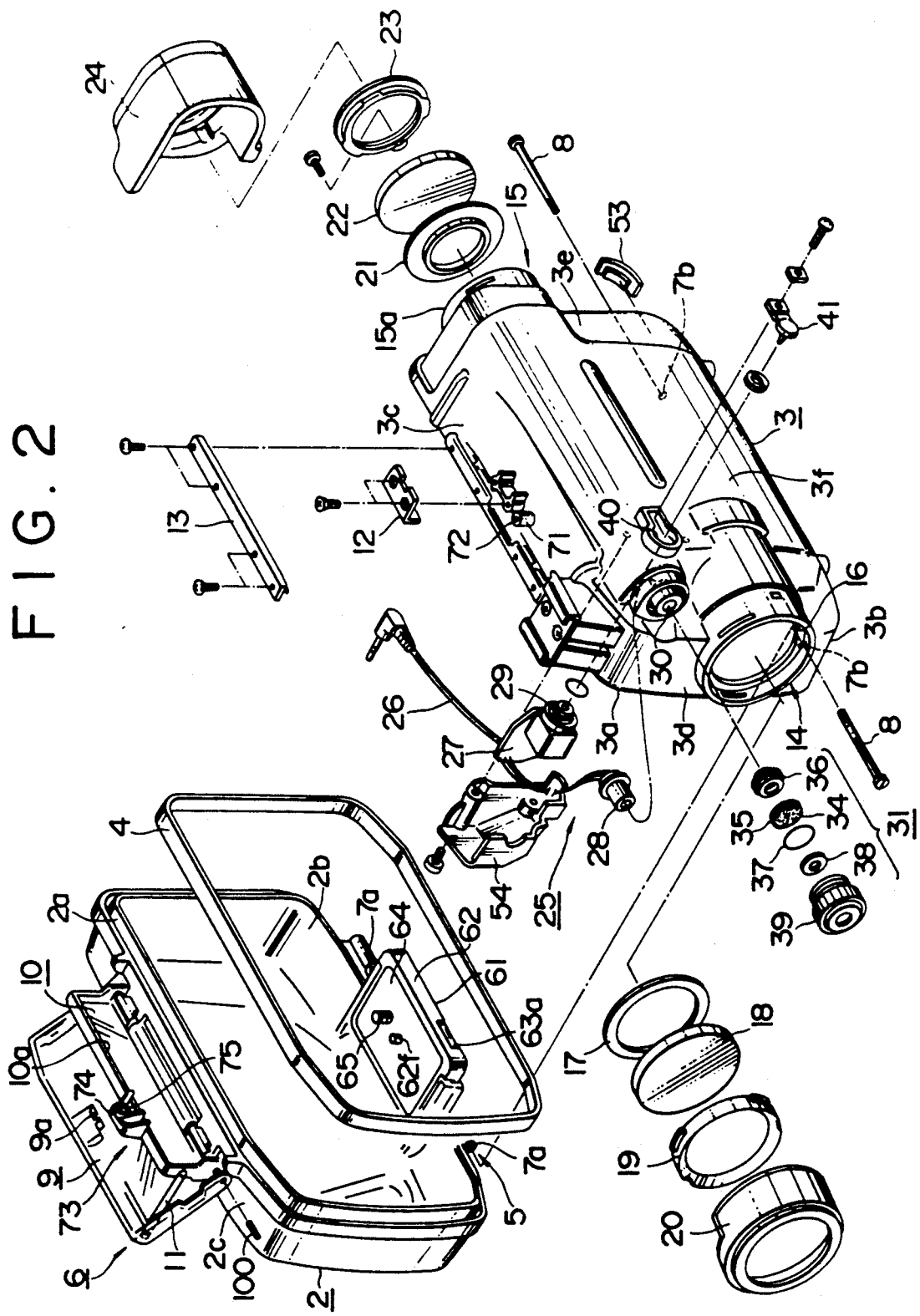
FIG. 2 is an exploded perspective view of the waterproof case of FIG. 1.

Referring to FIGS. 1 and 2, a case body 1 comprises a first half case 2 and a second half case 3. A rubber gasket 4 is placed between the respective brims 2a and 3a of the half cases 2 and 3 to join the half cases 2 and 3 together in a watertight fashion. The half cases 2 and 3 are coupled together by a hinge 5 connected to the respective bottom walls 2b and 3b of the half cases 2 and 3. The half cases 2 and 3 can be fastened together in a watertight fashion by a snap fastening mechanism 6 formed on the respective upper walls 2c and 3c of the half cases 2 and 3. The half cases 2 and 3 are formed of a synthetic resin by molding or of aluminum by die casting.

The hinge 5 comprises coaxial knuckles 7a and 7b formed respectively on the edges of the respective lower walls 2b and 3b of the half cases 2 and 3, and a hinge pin 8 having a threaded extremity, inserted through the knuckles 7a and 7b, and screwed in one of the knuckles 7a and 7b.

The snap fastening mechanism 6 comprises a snap plate 9, which serves also as an outer cover, pivotally supported by a pin 100 on the upper wall 2a of the first half case 2 at a position near the edge of the upper wall 2a so as to be turned on the pin 100 toward the upper wall 3c of the second half case 3, a locking plate 10, which serves also as an inner cover, having a size smaller than that of the snap plate 9 and pivotally supported by the pin 100 so as to be turned on the pin 100 toward the upper wall 3c of the second half case 3, a link plate 11 having one end pivotally joined to the snap plate 9 and the other end pivotally joined to the locking plate 10, a first catch 12 formed of a metal and fixed to the upper wall 3c of the second half case 3 so as to catch a lug 9a formed on the snap plate 9, and a second catch 13 formed of a metal and fixed to the upper wall 3c of the second half case 3 at a position near the edge of the upper wall 3c so as to engage the locking edge 10a of the locking plate 10.

The second half case 3 has a lens housing 14 formed on the front wall 3d thereof at a position corresponding to the taking lens L of a television camera C to be sealed in the case body 1, and a viewfinder housing 15 formed on the rear wall 3e thereof at a position corresponding to the viewfinder F of the television camera C as sealed in the case body 1. A gasket 17, a glass disk 18 and disk retainer 19 are fitted in that order in the opening 16 of the lens housing 14, and a lens cover 20 is put on the lens housing 14. A gasket 21, a glass disk 22 and a disk retainer 23 are fitted in that order in the opening 15a of the viewfinder housing 15 and an eye cap 24 is put on the viewfinder housing 15.

Figure 7:
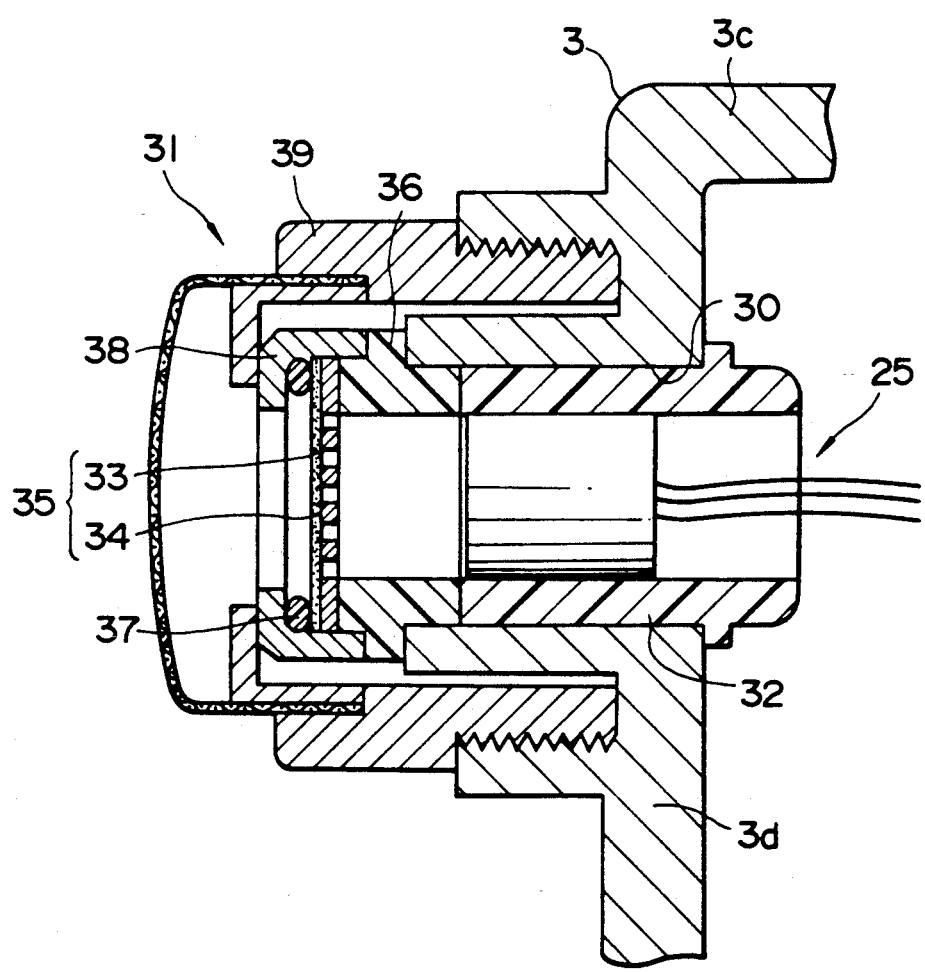
FIG. 7 is a sectional view of a microphone holding portion of the waterproof case of FIG. 1.

A microphone unit 25 is build in the front wall 3d of the second half case 3. As shown in FIGS. 2 and 7, the microphone unit 25 comprises a printed wiring board 27, a microphone cord 26 to be connected to the external microphone connector of the television camera C, an external microphone unit 28 electrically connected to the printed wiring board 27, and an external microphone connector 29 electrically connected to the printed wiring board 27. The external microphone unit 28 is fitted in and held in place in a microphone bore 30 formed in the front wall 3d of the second half case 3 and is protected by a waterproof protector 31 put on the front wall 3c of the second half case 3. The waterproof protector 31 comprises a protective sleeve 32, such as a rubber sleeve, receiving the external microphone unit 28 and fitted in the microphone bore 30, an elastic retaining ring 36 placed contiguously with and in front of the protective sleeve 32, a protective disk 35 formed by applying a waterproof, air-permeable sheet 34 to a perforated metal disk 33, and placed in contact with the front end of the elastic retaining ring 36, a holding ring 38 placed in front of the protective disk 35, and 0 ring 37 placed between the protective disk 35 and the holding ring 38, and a cover ring 39 screwed in the front wall 3c of the second half case 3.

The external microphone connector 29 is fitted fixedly in a bore 40 formed in the side wall 3f of the second half case 3. When the external microphone connector 29 is not used, the bore 40 is closed with a rubber plug 41.

Figure 3:
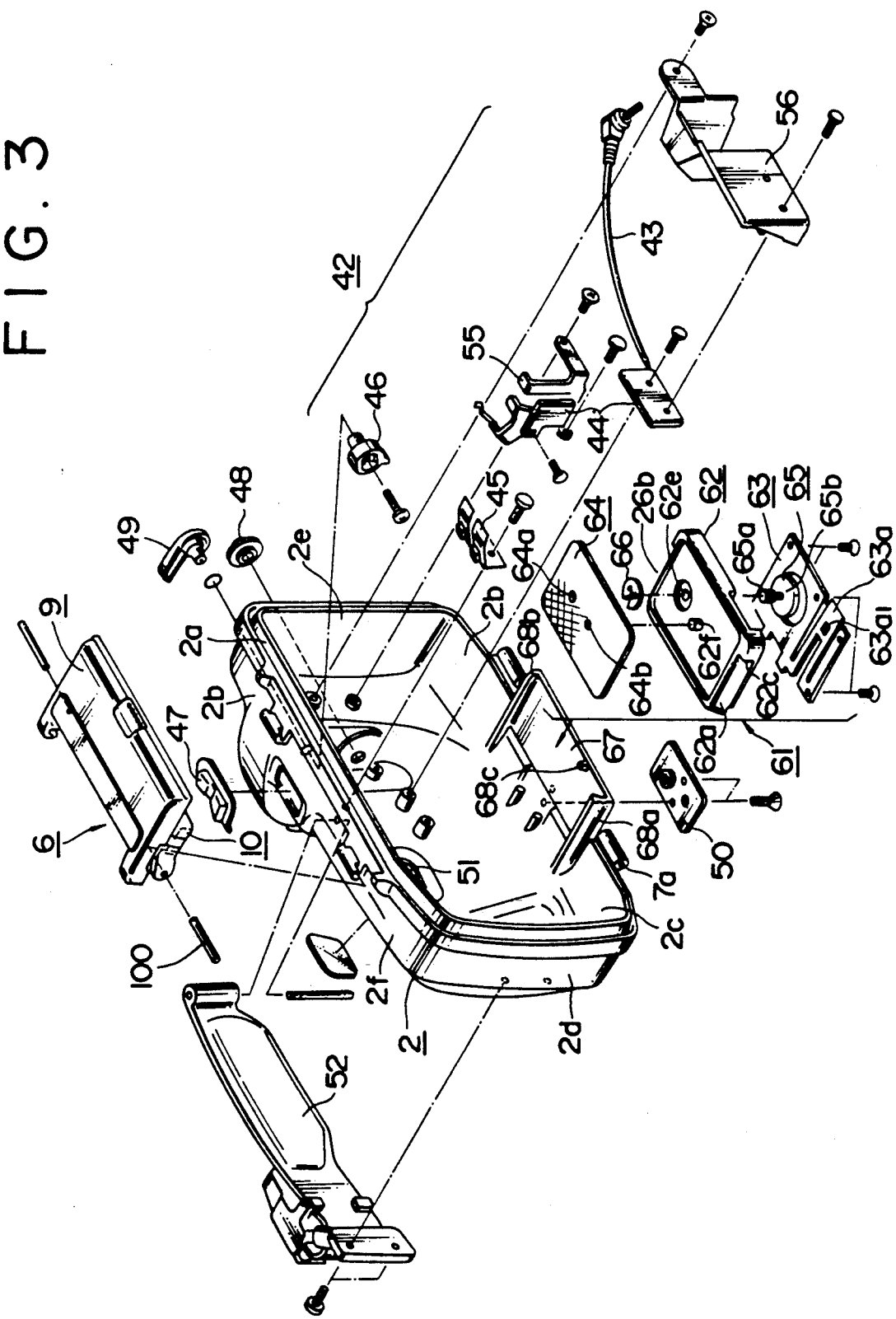
FIG. 3 is an exploded perspective view of a portion of the waterproof case of FIG. 1.

As best shown in FIG. 3, an operating unit 42 for operating the television camera C sealed in the case body 1 is built in the first half case 2. The operating unit 42 comprises a lens control switch 45 for varying the focal length of the taking lens L, a start switch 46, and a printed wiring board 44 connected to the remote control connector of the television camera C by a remote control cord 43 and electrically connected to the lens control switch 45 and the start switch 46. The lens control switch 45 is operated by means of a zoom button 47 provided on the upper wall 2c of the first half case 2, and the start switch 46 is operated by means of a push buton 48 provided on the rear wall 2e of the first half case 2. The push button 48 can be held at either a standby position or a working position with a locking lever 49.

A tripod receptacle 50 is fixed to the outer surface of the bottom wall 2b of the first half case 2. A peephole 51 is formed in the side wall 2f of the first half case 2 to enable viewing the running condition of the recording tape and confirming the residual length of the recording tape. A grip band 52 is attached to the outer surface of the side wall 2f.

As shown in FIG. 2, a leakage inspection window 53 is attached to the lower portion of the rear wall 3e of the second half case 3 to enable the inspection of the interior of the case body 1 for a leak of water into the case body1. In FIG. 2, indicated at 54 is a cover for covering the printed wiring board 27 provided within the second half case 3. In FIG. 3, indicated at 55 is a holder for holding the printed wiring board 44 within the first half case 2, and at 56 is a cover for covering the printed wiring board 27.

The television camera C is put on the waterproof case 1 thus constructed, the microphone cord 26 and the remote control cord 43 are connected respectively to the external microphone connector and remote control connector of the television camera C, and then the half cases 2 and 3 are closed up and fastened together to seal the television camera C in a watertight fashion in the case body 1. The television camera C is operated for taking and recording operation from outside the waterproof case 1.

A camera mounting shoe 61 is attached to the tripod receptacle of the television camera C, and a camera holder 62 is fixed to the first half case 2 to surely and fixedly seating the television camera C in the waterproof case 1 by a simple operation.

Figure 5:
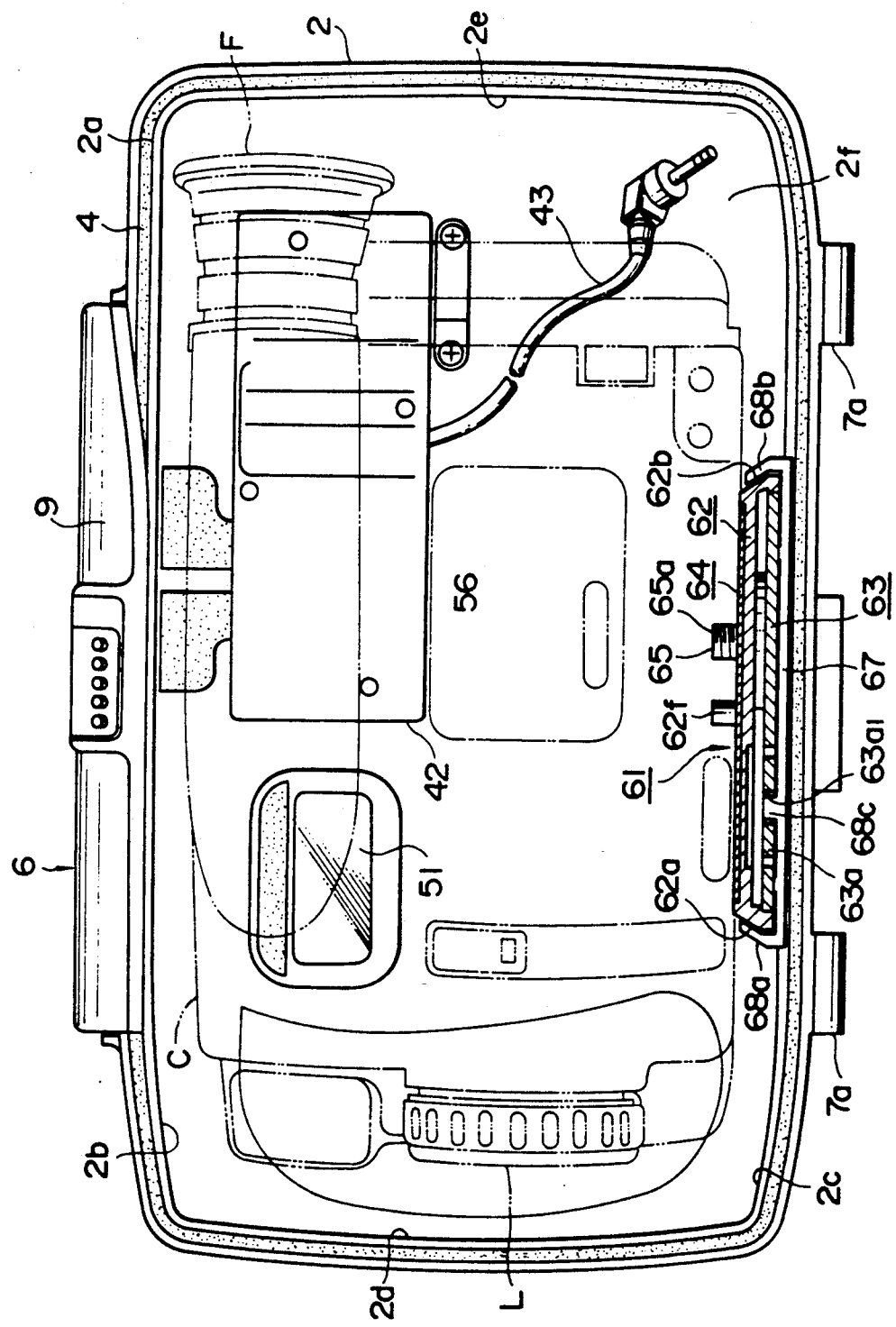
FIG. 5 is a partially sectional plan view of a half case included in the waterproof case of FIG. 1.

Referring to FIGS. 3 and 5, the camera mounting shoe 61 comprises: a substantially rectangular base plate 62 having flanges 62a and 62b inclined so that their upper portions approach each other and formed respectively along its front and rear sides, stopping projections 62c and 62d formed respectively at the right-hand ends, as viewed in FIG. 3, of the flanges 62a and 62b, and positioning a projection 62f formed on its upper surface, and provided with a through hole 62e near the positioning projection 62f; a plastic back plate 63 fixed to the lower surface of the base plate 62 and integrally having an elastic tongue 63a provided with a hole 63a$_1$; and a rubber friction pad 64 provided with a through hole 64a coinciding with the through hole 62e, and a through hole 64b receiving the positioning projection 62f therethrough, and attached adhesively to the upper surface of the base plate 62.

Figure 4:
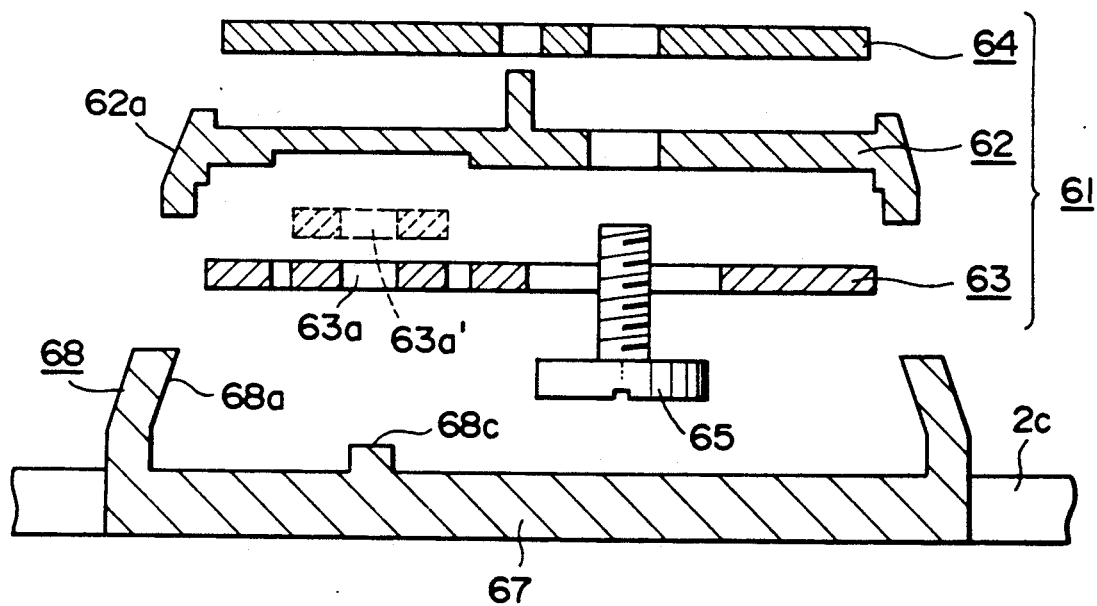
FIG. 4 is an exploded sectional view of a tripod receptacle included in the waterproof case of FIG. 1.

The threaded portion 65a of a camera mounting shoe fastening screw 65 to be screwed in the tripod receptacle of the television camera C is passed through the through hole 62e of the base plate 62 and the through hole 64a of the friction pad 64 so as to project from the upper surface of the friction pad 64, and a snap ring 66 is attached to the unthreaded portion of the camera mounting shoe fastening screw 65 to retain the camera mounting shoe fastening screw 65 on the camera mounting shoe 61 so that the camera mounting shoe fastening screw 65 is able to rotate and is unable to fall off the camera mounting shoe 61. The head 65b of the camera mounting shoe fastening screw 65 is able to sink in the back plate 63. FIG. 4 is a sectional view of the camera mounting shoe 61 in a vertical plane including the axis of the positioning projection 62f and that of the through hole 62e.

A camera seat 67 is formed integrally with the bottom wall 2b of the first half case 2 so as to extend on the bottom wall 3b of the second half case 3. The camera seat 67 is provided integrally with guide flanges 68a and 68b formed respectively along its front and rear sides so as to engage the flanges 62a and 62b, respectively. A projection 68c is formed on the upper surface of the camera seat 67 at a position corresponding to the through hole $63a_1$ formed in the elastic tongue 63a of the back plate 63. When the camera mounting shoe 61 is inserted in the space between the guide flanges 68a and 68b so that the inclined flanges 62a and 62b of the base plate 62 are guided respectively by the guide flanges 68a and 68b, the elastic tongue 63a is bent elastically by the projection 68c and rides over the projection 68c and, eventually, the stopping projections 62c and 62d of the base plate 62 come into contact with the outer ends of the guide flanges 68a and 68b to limit the insertion of the camera mounting shoe 61. In this state, the through hole $63a_1$ of the elastic tongue 63a coincides with the projection 68c and hence the elastic tongue 63a is allowed to snap into place. In FIG. 4, indicated at 63a' is the elastic tongue 63a in a temporarily bent position. Thus, the camera mounting shoe 61 can snap into place on the camera seat 67. In this state, the camera mounting shoe 61 is restrained from vertical movement by the dovetail engagement of the flanges 62a and 62, and the guide flanges 68a and 68b and from horizontal movement by the engagement of the elastic tongue 63a and the projection 68c. Thus, the camera mounting shoe 61 is held securely on the first half case of the case body 1. The camera seat 67 having the guide flanges 68a and 68b, and the projection 68c is formed integrally with the first half case 2 by molding a synthetic resin.

In separating the camera mounting shoe 61 from the camera seat 67, the elastic tongue 63a is bent elastically toward the base plate 62 so that the elastic tongue 63a is separated from the projection 68c, and then the camera mounting shoe 61 is pulled horizontally off the camera seat 67.

Referring to FIG. 5, the section of the camera mounting shoe 61 shown in FIG. 5 being taken on a vertical plane different from that of the section of the same shown in FIG. 4, in placing the television camera C in the case body 1, the camera mounting shoe 61 is joined to the bottom wall of the television camera C with its positioning projection 62f fitted in a positioning hole formed in the bottom wall of the television camera C, and then the camera mounting shoe fastening screw 65 is screwed in the tripod receptacle of the television camera C to fasten the camera mounting shoe 61 firmly to the television camera C. The engagement of the positioning projection 62f and the positioning hole of the television camera C restrains the television camera C from turning relative to the camera mounting shoe 61.

The television camera C thus joined fixedly to the camera mounting shoe 61 is fitted in the first half case 2 while the camera mounting shoe 61 is inserted in the camera seat 67 to hold the television camera C securely in the first half case 2 by the engagement of the camera mounting shoe 61 and the camera seat 67. Then, the second half case 3 is joined to the first half case 2, and the half cases 2 and 3 are fastened together by the snap fastening mechanism 6 to seal the television camera C in a watertight fashion in the case body 1.

Although the elastic tongue 63a provided with the through hole $63a_1$ in this embodiment is formed integrally with the back plate 63, it is also possible to employ an elastic tongue 63a separate from the back plate 63 and to attach the back plate 63 and the separate elastic tongue 63a individually to the base plate 62. When the back plate 63 and the elastic tongue 63a are separate members, the elastic tongue 63a can be formed of an optional appropriate material regardless of the material of the back plate 63.

Since the case body 1 is closed in a watertight fashion, in some cases, it is difficult to open the case body 1; that is, if the television camera C is packed in the case body 1 in an atmosphere where the ambient temperature is comparatively high, and the television camera C is used in an atmosphere where the ambient temperature is comparatively low, such as in the water or outdoors in the rain, the pressure within the case body 1 drops below the atmospheric pressure to form a vacuum within the case body 1, so that it is difficult to open the case body 1 before the temperature of the air in the case body 1 increases to the comparatively high temperature. To avoid such a difficulty, the case body 1 is vented to relieve a vacuum formed in the case body 1 before opening the case body 1.

Figure 6:
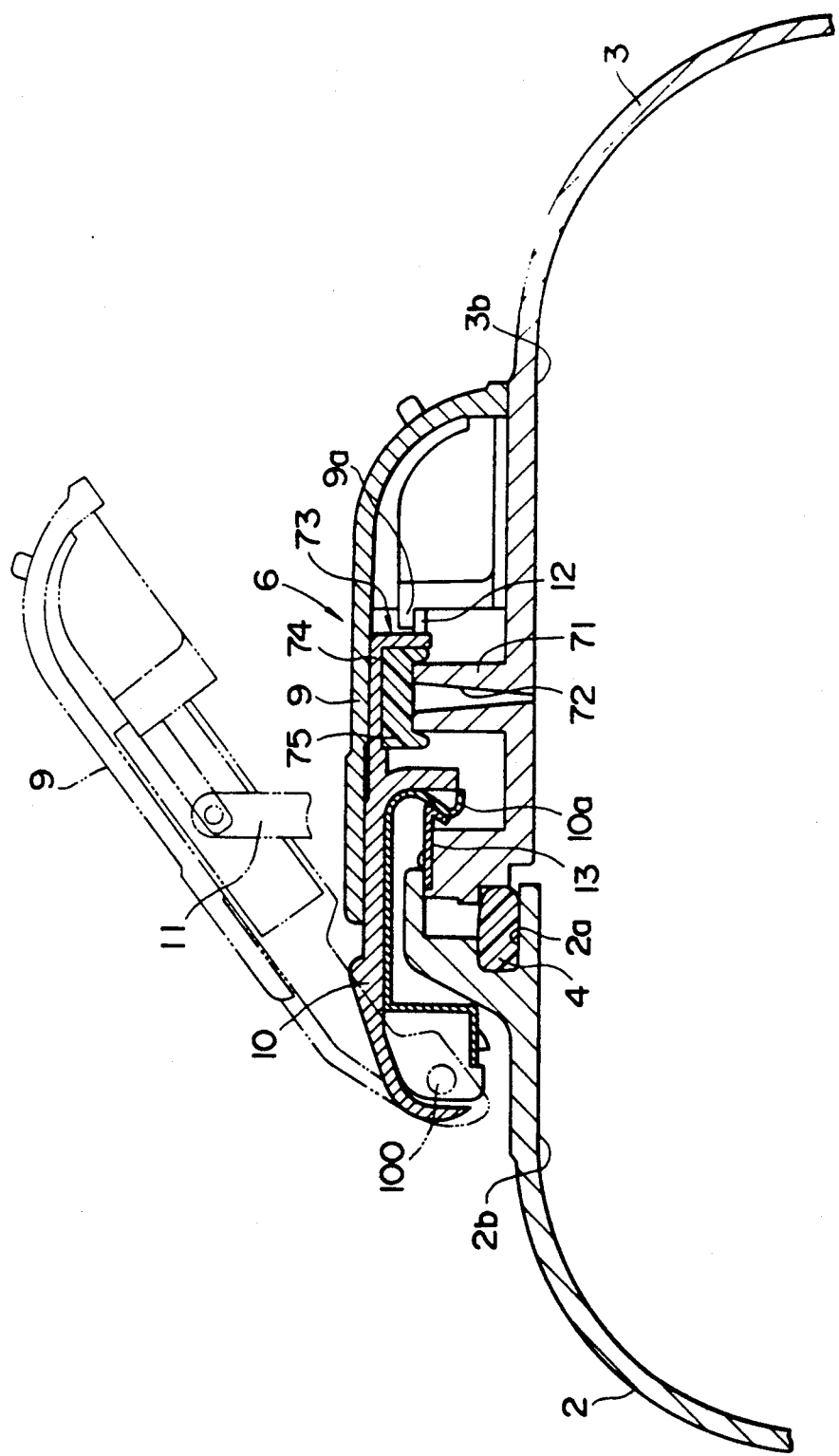
FIG. 6 is a sectional view of a locking mechanism.

Referring to FIGS. 2 and 6, a tubular projection 71 having a vent hole 72 is formed on the upper wall 3c of the second half case 3, and the locking plate 10 is provided with a stopper 73. The stopper 73 consists of a protrusion 74 formed integrally with the locking plate 10, and a compressible sealing element 75.

When the snap plate 9 is pressed to its fastening position after closing the case body 1, the locking plate 10 is turned to the locking position on the second half case 3 and the locking edge 10a of the locking plate 10 engages the second catch 13. In this state, the compressible sealing element 75 of the stopper 73 is pressed to the upper end of the tubular projection 71 to close the vent hole 72 of the tubular projection 71 to form a watertight space within the case body 1. When the snap plate 9 is unfastened to release the locking plate 10 from the second catch 13 through the link plate 11 to take out the television camera C from the case body 1, the stopper 73 is separated from the tubular projection 71 to open the vent hole 72 to enable the interior of the case body 1 to communicate with the atmosphere by means of the vent hole 72 and, consequently, the case body 1 can readily be opened.

Even if the snap plate 9 serving as an outer cover is opened accidentally while the television camera C sealed in the case body 1 is used in the water or in the rain, the case body 1 remains watertight and the television camera C is able to operate without hindrance, because the locking plate 10 remains in place with the stopper 73 pressed to the upper end of the tubular projection 71.

It is also possible to form the vent hole 72 in the upper wall 3c of the second half case 3 and to form the stopper 73 on the inner surface of the locking plate 10 so close the vent hole 72 when the locking plate 10 is pressed to its locking position.

Although the present invention has been described as applied to a waterproof case for a television camera, it is also possible to apply the present invention to a waterproof case for a portable instrument other than the television camera, such as a still camera.

As is apparent from the foregoing description, a waterproof case for a camera in accordance with the present invention is provided with a camera mounting mechanism comprising a camera mounting shoe provided with an elastic retaining member and detachably attached to the tripod receptacle of the camera, and a camera seat formed in the waterproof case and capable of fitly engaging the camera mounting shoe and of locking the elastic retaining tongue in place, the camera mounting mechanism enables setting the camera in and removing the same from the waterproof case by a simple, single operation, the camera mounting mechanism holds the camera securely in the waterproof case so that the camera will not jolt even if a high pressure is applied to the camera to operate the camera from outside the waterproof case, and the waterproof case is inexpensive and simple in construction.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A waterproof case for a camera, comprising:
   a case body formed by coupling together a first half case and a second half case by a hinge, and capable of forming an airtight space therein;
   a camera mounting shoe provided with a screw to be screwed in the tripod receptacle of the camera, and a back plate having a flexible retaining tongue;
   a camera seat formed on the first half case so as to receive the camera mounting shoe fitly; and
   a locking member formed in the camera seat so as to engage the flexible retaining tongue to lock the camera mounting shoe securely on the camera seat when the camera mounting shoe is inserted in the camera seat.

2. A waterproof case for a camera according to claim 1, wherein said flexible retaining tongue is provided with a through hole for receiving said locking member, the flexible retaining tongue is deflected by the locking member as the camera mounting shoe is inserted in the camera seat, and the deflected flexible retaining tongue snaps back to its normal shape to engage the locking member upon the complete insertion of the camera mounting shoe into the camera seat.

3. A waterproof case for a camera according to claim 1, wherein said camera seat has guide means for guiding said camera mounting shoe in inserting the camera mounting shoe into the camera seat, and for stopping said camera mounting shoe in place on the camera seat.

4. A waterproof case for a camera according to claim 2 or 3, said first and second half cases are formed of asynthetic resin, and said locking member is formed integrally with said camera seat by molding a synthetic resin.

5. A waterproof case for a camera according to claim 2, wherein said flexible retaining tongue is formed of a synthetic resin.

* * * * *